United States Patent
Sudarshan et al.

(10) Patent No.: US 9,885,124 B2
(45) Date of Patent: Feb. 6, 2018

(54) METHOD OF GROWING HIGH QUALITY, THICK SIC EPITAXIAL FILMS BY ELIMINATING SILICON GAS PHASE NUCLEATION AND SUPPRESSING PARASITIC DEPOSITION

(71) Applicant: UNIVERSITY OF SOUTH CAROLINA, Columbia, SC (US)

(72) Inventors: Tangali S. Sudarshan, Columbia, SC (US); Haizheng Song, Columbia, SC (US); Tawhid Rana, Columbia, SC (US)

(73) Assignee: University of South Carolina, Columbia, SC (US)

( * ) Notice: Subject to any disclaimer, the term of this patent is extended or adjusted under 35 U.S.C. 154(b) by 517 days.

(21) Appl. No.: 14/360,064

(22) PCT Filed: Nov. 20, 2012

(86) PCT No.: PCT/US2012/066087
§ 371 (c)(1),
(2) Date: May 22, 2014

(87) PCT Pub. No.: WO2013/078219
PCT Pub. Date: May 30, 2013

(65) Prior Publication Data
US 2014/0338588 A1    Nov. 20, 2014

Related U.S. Application Data

(60) Provisional application No. 61/563,250, filed on Nov. 23, 2011, provisional application No. 61/638,770, (Continued)

(51) Int. Cl.
*C30B 29/36* (2006.01)
*C30B 25/18* (2006.01)
(Continued)

(52) U.S. Cl.
CPC ............ *C30B 25/186* (2013.01); *C30B 25/14* (2013.01); *C30B 25/165* (2013.01);
(Continued)

(58) Field of Classification Search
CPC ............................... C30B 29/36; C30B 25/14
See application file for complete search history.

(56) References Cited

U.S. PATENT DOCUMENTS

2004/0224089 A1    11/2004 Singh et al.
2007/0240630 A1    10/2007 Leonard et al.
(Continued)

OTHER PUBLICATIONS

Pedersen et al., "Very high epitaxial growth rate of SiC using MTS as chloride-based precursor", Surface & Coatings Technology 201 (2007) 8931-8934.
(Continued)

*Primary Examiner* — Robert M Kunemund
(74) *Attorney, Agent, or Firm* — Dority & Manning, PA

(57) ABSTRACT

Methods for forming an epilayer on a surface of a substrate are generally provided. For example, a substrate can be positioned within a hot wall CVD chamber (e.g., onto a susceptor within the CVD chamber). At least two source gases can then be introduced into the hot wall CVD chamber such that, upon decomposition, fluorine atoms, carbon atoms, and silicon atoms are present within the CVD chamber. The epilayer comprising SiC can then be grown on the surface of the substrate in the presence of the fluorine atoms.

23 Claims, 11 Drawing Sheets

Related U.S. Application Data filed on Apr. 26, 2012, provisional application No. 61/716,020, filed on Oct. 19, 2012.

(51) Int. Cl.

| | |
|---|---|
| *H01L 21/02* | (2006.01) |
| *H01L 21/306* | (2006.01) |
| *C30B 25/14* | (2006.01) |
| *C30B 25/16* | (2006.01) |
| *C30B 25/20* | (2006.01) |
| *H01L 29/16* | (2006.01) |

(52) U.S. Cl.
CPC ............ *C30B 25/183* (2013.01); *C30B 25/20* (2013.01); *C30B 29/36* (2013.01); *H01L 21/02019* (2013.01); *H01L 21/0262* (2013.01); *H01L 21/02082* (2013.01); *H01L 21/02378* (2013.01); *H01L 21/02447* (2013.01); *H01L 21/02516* (2013.01); *H01L 21/02529* (2013.01); *H01L 21/02658* (2013.01); *H01L 21/30608* (2013.01); *H01L 29/1608* (2013.01)

(56) References Cited

U.S. PATENT DOCUMENTS

| | | | |
|---|---|---|---|
| 2008/0199977 A1 | 8/2008 | Weigel et al. | |
| 2010/0288192 A1 | 11/2010 | Okuuchi | |
| 2011/0006310 A1* | 1/2011 | Nagasawa | H01L 29/045 257/77 |
| 2011/0059003 A1 | 3/2011 | Sudarshan et al. | |

OTHER PUBLICATIONS

Search Report for corresponding PCT Application No. PCT/US12/66087 dated Jan. 29, 2013, 4 pages.

Rana et al., "Behavior particles in the growth reactor and their effect on silicon carbide epitaxial growth", Materials Science Forum, vols. 717-720, 2012, p. 153-156.

Itoh et al., "High-quality 4H—SiC homoepitaxial layers grown by step-controlled epitaxy", Appl. Phys. Lett. 65, 11, Sep. 12, 1994, p. 1400-1402.

Chung et al., "Direct observation of basal-plane to threading-edge dislocation conversion in 4H—SiC epitaxy", Journal of Applied Physics 109, 2011, p. 094906-094906-5.

Stahlbush et al., "Basal plane dislocation reduction in 4H—SiC epitaxy by growth interruptions", Applied Physics Letters 94, 2009, 041916-041916-3.

Myers et al., "High growth rates (>30 μm/h) of 4H—SiC epitaxial layers using a horizontal hot-wall CVD reactor", Journal of Crystal Growth 285, 2005, p. 486-490.

La Via et al., "4H—Sic epitaxial layer growth by trichlorosilane (TCS)", Journal of Crystal Growth 311, 2008,p. 107-113.

Talukdar et al., "Aerosol dynamics modeling of silicon nanoparticle formation during silane pyrolysis: a comparison of three solution methods", Aerosol Science 35, 2004, p. 889-908.

Gutmann, Viktor, *Halogen Chemistry*, Academic Press, 1967, vol. 2, p. 171.

Ganguly et al., "Polycrystalline silicon carbide films deposited by low-power radio-frequency plasma decomposition of $SiF_4$—$CF_4$—$H_2$ gas mixtures", J. Appl. Phys. 69, (7) Apr. 1991, p. 3915-3923.

Cicala et al., "Plasma deposition of amorphous SiC:H,F alloys from $SiF_4$—$CH_4$—$H_2$ mixtures under modulated conditions", J. Appl. Phys. 79 (11), Jun. 1, 1996, p. 8856-8858.

Kida et al., "Growth and Characterization of SiC Films by Hot-Wire Chemical Vapor Deposition at Low Substrate Temperature Using $SiF_4$/$CH_4$/$H_2$ Mixtures", Japanese Journal of Applied Physics, vol. 47, No. 1, pp. 566-568.

Pedersen et al., "Very high growth rate of 4H—SiC epilayers using the chlorinated precursor methyltrichlorosilane (MTS)", Journal of Crystal Growth, 307, 2007, p. 334-340.

Chowdhury, "High growth rate 4H—SiC epitaxial growth using dichlorosilane in a hot-wall CVD reactor", Journal of Crystal Growth, 316, 2011, p. 60-66.

Klein et al, "Lifetime-limiting defects in n-4H—SiC epilayers", Applied Physics Letters, 88, 2006, 052110-052110-3.

* cited by examiner

METHOD OF GROWING HIGH QUALITY, THICK SiC EPITAXIAL FILMS BY ELIMINATING SILICON GAS PHASE NUCLEATION AND SUPPRESSING PARASITIC DEPOSITION

PRIORITY INFORMATION

The present application claims priority to U.S. Provisional Patent Application Ser. No. 61/716,020 titled "A Method for Elimination of Basal Plane Dislocations and In-Grown Stacking Faults with No Surface Degradation for High Quality SiC Epitaxial Films" of Sudarshan, et al. filed on Oct. 19, 2012; to U.S. Provisional Patent Application Ser. No. 61/638,770 titled "Method of Growing High Quality, Thick Silicon Carbide Homoepitaxial Films by Eliminating Silicon Gas Phase Nucleation and Silicon Parasitic Deposition" of Sudarshan, et al. filed on Apr. 26, 2012; and to U.S. Provisional Patent Application Ser. No. 61/563,250 titled "Substrate Pretreatment Method for Reduction/Elimination of Basal Plane Dislocations and In-Grown Stacking Faults with No Surface Degradation for High Quality SiC Epitaxial Films" of Sudarshan, et al. filed on Nov. 23, 2011. The disclosures of all of these priority applications are incorporated by reference herein.

GOVERNMENT SUPPORT CLAUSE

This invention was made with government support under N00014-10-1-0530 awarded by the Office of Naval Research. The government has certain rights in the invention.

BACKGROUND OF THE INVENTION

One of the greatest challenges of growing SiC epitaxial films by high temperature chemical vapor deposition (CVD) is to restrict the gas phase nucleation or cluster formation or aerosol formation of silicon during growth. These particles adversely influence the growth by reducing the growth rate due to precursor losses and degrade the crystal quality since the Si droplets are carried to the crystal growth surface by the $H_2$ carrier gas. Moreover, liquid aerosol particles are viscous and adhere to the gas delivery system (parasitic deposition) and causes severe degradation of the reactor parts during epitaxial growth. These depositions (parasitic deposition) are generally flaky, loosely bound, and can be carried to the growth surface during the growth resulting in degradation of crystal quality, introducing defects in the growing epitaxial film. The aforesaid condition is specifically severe at higher precursor gas flow rates required to achieve high film growth rates. Long duration epitaxial growth to achieve thick epitaxial films is also very inconvenient using conventional Si precursors due to excessive Si cluster formation and parasitic deposition in the reactor.

Typical growth rates using silane as the Si precursor in SiC CVD are 1 μm/hour-10 μm/hour. Supersaturation and Si cluster formation prohibit increased rate of mass transport by higher flow rate of the silane precursor. At increased flow, formed Si clusters degrade crystal quality as noted earlier. Cluster formation of particles (Si) is the leading cause of yield loss in semiconductor processing and the critical particle size should be reduced as the microelectronic size decreases.

The major drawback associated with the silane chemistry in achieving high growth rates is the relatively weak bond strength of the Si—H (318 kJ/mol) bond in $SiH_4$ causing it to dissociate easily (and very early in the gas delivery system) into elemental Si. In high temperature silicon carbide (SiC) chemical vapor deposition (CVD) using silane, the dissociated elemental silicon with free dangling bonds can easily form the Si—Si bond during their collisions and initiate liquid Si droplet or aerosol formation. The condition for Si droplet or aerosol formation is particularly severe in SiC CVD (compared to Si CVD), using silane gas, where high temperature (typically 1550° C.) is essential to achieve SiC homoepitaxial growth.

To prevent Si droplet formation in SiC CVD, chlorinated precursors (for e.g., $SiCl_4$, $SiHCl_3$, $SiH_2Cl_2$) are typically used. The silicon-chlorine bond is higher in chlorosilanes (for e.g., dichlorosilane, DCS, $SiH_2Cl_2$) compared to silicon-hydrogen bond in silane (381 kJ/mol versus 318 kJ/mol). The silicon-chlorine bond strength in dichlorosilane is strong enough to prevent silicon droplet formation in low temperature Si CVD growth (typically 1000° C.) where the stronger Si—Cl bond restricts elemental Si formation. However, in higher temperature SiC growth (typically 1500° C. or above), dichlorosilane ($SiH_2Cl_2$) can also generate silicon droplets with increased parasitic deposition at higher gas flow rates leading to degraded epilayer surface morphology. Parasitic deposition in the reactor, using DCS, is discussed later in comparison to conventional silane gas (see also, FIGS. 2-3).

Silicon tetrafluoride gas has been used for polycrystalline silicon carbide films deposited by low power radio frequency plasma decomposition of $SiF_4$. Silicon tetrafluoride gas has also been used for growing μ-crystalline 3C growth using low temperature hotwire CVD using Si substrate. However, homoepitaxial growth on SiC substrates by hot wall, high temperature CVD has not been reported for high quality, thick film growth. Moreover, it is believed in the art that $SiF_4$ is not a suitable gas for SiC epitaxial growth due to its "too strong" Si—F bond (565 kJ/mol).

A continuing need exists for higher growth rates that can result in a high quality, thick homoepitaxial SiC epilayer, particularly those methods that can inhibit and/or prevent formation of silicon droplets and/or parasitic growth during CVD.

Additionally, in SiC bipolar devices, basal plane dislocations (BPDs) in the epitaxial regions generate Shockley stacking faults (SFs) under device current stress, and increase the forward voltage drift. In SiC epitaxial growth, the BPDs mainly come from the substrate. About 70-90% of BPDs on the substrate are converted to benign threading edge dislocations (TEDs), but 10-30% of BPDs propagate from the substrate into the epitaxial layer causing a BPD density of $10^2$-$10^3$ $cm^{-2}$ in the epilayer. For sufficient yield (up to 90%) of bipolar devices, without forward voltage drift reliability problems, it is essential that the density of these performance-limiting defects in the epitaxial layer be less than 10 $cm^{-2}$.

It has also been reported that in SiC epitaxial growth, the conversion of BPDs occurs during the growth of ~20 μm thick epilayer, which indicates that there may be BPDs buried within the 20 μm epilayer even though no BPDs are observed on the top surface of over 20 μm thick epilayer. These buried BPDs may still be converted to Shockley SFs under current stress, and these SFs will extend into the drift layers and degrade the device performance. The deeper the depth from the epilayer surface that the BPDs are buried, the higher the current density that is required to convert them to SFs.

In order to reduce the BPD density in the epilayer (i.e., enhance BPD to TED conversion rate), one of the effective methods is etching the substrate in a molten pure KOH or regular KOH—NaOH eutectic solution prior to the epitaxial growth. Both etching methods need to generate etch pits at the points of BPDs intersecting the substrate surface. BPD etch pits >10 μm in diameter are required to achieve BPD density <10 cm$^{-2}$ on the epilayer surface. In addition, due to the aggressive etching methods by molten KOH or regular KOH—NaOH eutectic, surface damage cannot be avoided even in the defect free regions of the substrate. All of the etch pits (including BPDs, TEDs and threading screw dislocations (TSDs)) and the surface damage on the substrate will be replicated to the epilayer surface. Post-polishing process is mandatory in order to obtain a smooth surface for device fabrication on the resulting epilayer, which reduces the practicability of the substrate etching method.

Therefore, conversion of BPD to TED near the epilayer/substrate interface without degrading the surface morphology is an important need for the reliability of SiC devices.

SUMMARY

Objects and advantages of the invention will be set forth in part in the following description, or may be obvious from the description, or may be learned through practice of the invention.

Methods are generally provided for forming an epilayer on a surface of a substrate. For example, a substrate can be positioned within a hot wall CVD chamber (e.g., onto a susceptor within the CVD chamber). At least two source gases can then be introduced into the hot wall CVD chamber such that, upon decomposition, fluorine atoms, carbon atoms, and silicon atoms are present within the CVD chamber. The epilayer comprising SiC can then be grown on the surface of the substrate in the presence of the fluorine atoms.

In one embodiment, the at least two source gases comprise: a fluorinated Si-source gas (e.g., $SiH_xF_y$, where x=0, 1, 2, or 3 and y=4-x) and a carbon source gas (e.g., a hydrocarbon gas, such as methane, ethane, propane; or a chlorinated carbon gas, such as $CH_3Cl$; or mixtures thereof). In an alternative embodiment, the at least two source gases comprise: a Si-source gas (either fluorinated or non-fluorinated, such as silane or a chlorinated silicon gas), a fluorine source gas (e.g., HF), and a carbon source gas. In yet another embodiment, the at least two source gases comprise: a fluorinated carbon source gas (e.g., $CH_xF_y$, where x=0, 1, 2, or 3 and y=4-x) and a Si-source gas (either fluorinated or non-fluorinated, such as silane or a chlorinated silicon gas). In still another embodiment, the at least two source gases comprise: a combination Si- and C-source gas (e.g., comprising Si, C, and Cl, such as methyltrichlorosilane), and a fluorine source gas (e.g., HF). Further, in another embodiment, a single precursor gas containing Si, C, and F, such as methyltrifluorosilane, can be used as the source gas.

The hot wall CVD chamber can, in one embodiment, have a growth temperature of about 1400° C. to about 2000° C.

In most embodiments, parasitic deposition is substantially prevented, through the presence of the fluorine atoms, on the reactor parts to increase the reusability of the reactor parts and enable longer duration growth, especially when compared to otherwise identical reaction conditions without the presence of the fluorine atoms.

In one embodiment, a buffer epilayer of SiC can be grown on the surface of the SiC substrate prior to growing the epilayer on the surface of the substrate. With or without the presence of the buffer layer and prior to growing the epilayer on the surface of the substrate, a molten mixture (e.g., including KOH and a buffering agent) can be applied onto the surface of the SiC substrate to form a treated surface thereon in certain embodiments.

Methods are also generally provided for growing a bulk crystal on a surface of a seed substrate via introducing at least two source gases into a hot wall CVD chamber such that, upon decomposition, fluorine atoms, carbon atoms, and silicon atoms are present within the CVD chamber; and growing a bulk crystal on the surface of the seed substrate positioned within the CVD chamber, wherein the bulk substrate comprises SiC.

Other features and aspects of the present invention are discussed in greater detail below.

BRIEF DESCRIPTION OF THE DRAWINGS

A full and enabling disclosure of the present invention, including the best mode thereof to one skilled in the art, is set forth more particularly in the remainder of the specification, which includes reference to the accompanying figures.

DETAILED DESCRIPTION OF INVENTION

Figure 1:
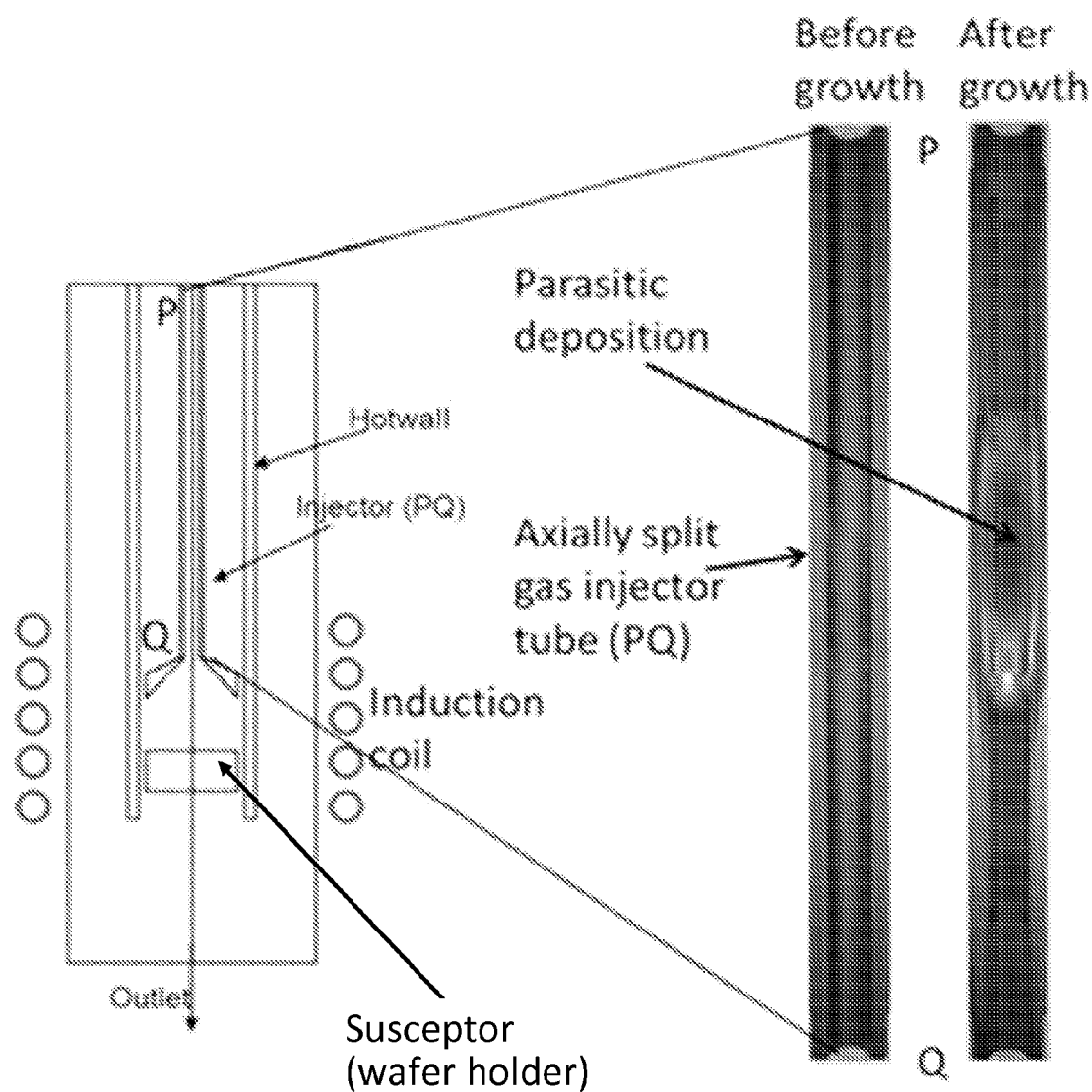
FIG. 1 shows a general schematic diagram of an exemplary hotwall CVD furnace, along with a comparison of axially split gas injector tubes showing parasitic deposition after epitaxial growth of a SiC epilayer using silane as Si-source gas.

The following description and other modifications and variations to the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the following description is by way of example only, and is not intended to limit the invention.

In the present disclosure, when a layer is being described as "on" or "over" another layer or substrate, it is to be understood that the layers can either be directly contacting each other or have another layer or feature between the layers, unless expressly stated to the contrary. Thus, these terms are simply describing the relative position of the layers to each other and do not necessarily mean "on top of" since the relative position above or below depends upon the orientation of the viewer or the specific application for device fabrication.

Chemical elements are discussed in the present disclosure using their common chemical abbreviation, such as commonly found on a periodic table of elements. For example, hydrogen is represented by its common chemical abbreviation H; helium is represented by its common chemical abbreviation He; and so forth.

Various methods are generally provided for reducing and even eliminating basal plane dislocation density in SiC epilayers grown using hotwall CVD processes on a SiC substrate in order to achieve high quality epitaxy. For example, each of these process steps can be utilized alone, or in combination with each other, to achieve high quality epitaxial growth. It is noted that terms "epitaxial film" and "epilayer" are used interchangeably in the present disclosure.

I. Silicon Carbide Homoepitaxial Growth Using Fluorine Chemistry

In one embodiment, epitaxial growth of a SiC epilayer is generally provided by CVD utilizing fluorine chemistry in the system. Such epitaxial growth methods are generally provided, with or without the pretreatment of the substrate described below. Utilizing fluorine chemistry in a CVD epitaxial growth, a thick, low doped epitaxial film (commonly referred to "epilayer" or "epi") can be grown with excellent surface morphology, crystal quality, and polytype uniformity. The methods of growing such epilayers utilize an environment that is substantially free from silicon-droplets to achieve relatively high growth rates while maintaining the desired properties. In particular, the methods of growing the epilayers utilize fluorine in the system (e.g., $SiF_4$ gas as the silicon source gas) in a hot wall CVD reactor. These methods can achieve thick, low doped epilayers with excellent surface morphology, crystal quality and polytype uniformity grown at high growth rates in a Si droplet and Si parasitic deposition-free environment, the combination of which is not attainable by using other, conventional silicon precursors. The above method of utilizing fluorine in the system (e.g., $SiF_4$ gas as the silicon source gas) can be easily extended to grow bulk SiC boules of different doping concentration (n or p type) by the CVD method or in combination with the physical vapor transport (PVT) method (gas assisted PVT).

In general, fluorine in the system allows for silicon-fluorine bonds to form (or already be formed, e.g., in the case of $SiF_4$ gas), thus inhibiting and/or preventing silicon droplets to form in the system. The Si—F bond strength (565 kJ/mol) is much higher compared to that of the Si—Si bond (222 kJ/mol), which is the fundamental reason for Si cluster suppression (or suppressed formation of Si—Si bonds). Additionally, the Si—F bond strength is stronger than other Si-halogen bonds (Si—Cl: 381 kJ/mol; Si—Br: 309 kJ/mol; and Si—I: 234 kJ/mol). Since the Si—F bond (e.g., as in $SiF_4$) is the strongest of the halogens, this is the gas of choice to achieve the best possible condition for Si droplet-free environment suitable for high temperature SiC CVD epitaxial growth over other halogenated silane gases.

Thus, growth of the epitaxial film of SiC can be achieved in the CVD chamber in an atmosphere that includes Si—Si vapor in an amount that is less than 5% by volume, due to the presence of fluorine in the system substantially inhibiting and/or preventing the formation of such Si—Si bonds. For example, the CVD chamber can have an atmosphere that includes Si—Si vapor in an amount that is less than 1% by volume, and can be, in one embodiment, substantially free from Si—Si vapor. However, due to a chemical reaction with the carbon source gas (and particularly a hydrocarbon gas, such as propane), an epilayer of SiC can be formed on the substrate's surface.

By including fluorine in the system, good quality SiC epitaxial films can be grown at high growth rates and the doping of the grown layer can be controlled over a wide range (e.g., semi-insulating to $>10^{17}$ $cm^{-3}$ n or p type) by adjusting the C/Si ratio or introducing nitrogen or aluminum or boron or any other appropriate dopant. Additionally, parasitic deposition in the reactor is significantly reduced when fluorine is in the system, especially compared to conventional gases (including silane and chlorosilane gases). Reduction of silicon droplet in the chamber enables increased source gas flow rates and long term growth for a thicker epilayer (e.g., greater than about 100 µm, including bulk growth) with a smooth surface (e.g., a roughness RMS of about 0.5 nm or less).

Fluorine can be introduced into the system during growth via the use of a fluorinated Si-source gas (e.g., SiF$_4$), via the use of a fluorine source gas (e.g., HF) with any combination of a silicon and carbon source gas or gases, or via a fluorinated carbon source gas (e.g., CF$_4$). All of these embodiments are discussed in greater detail below.

By using this gas chemistry (e.g., containing fluorine in the system), epi growth and the reactor environment are improved with any off cut substrate (e.g. 0°, 2°, 4°, 8° etc.) in any direction (e.g., 11$\bar{2}$0, 1100 etc.) or any polytype (3C, 4H, 6H etc.) or any growth planes (e.g., c planes, m planes, a planes etc.) since a gas phase nucleation-free condition fundamentally improves crystal growth irrespective of the substrate type (orientation, polytype etc.) and regardless of the diameter of the wafer. This chemistry improves epi crystal quality in any crystal growth reactor (e.g. horizontal, vertical, planetary, single or multiple wafer reactor, etc.) since the basic principle of mass transport is applicable to any reactor geometry.

CVD growth of the epitaxial film of SiC can be achieved at a growth rate of about 1 µm/hour or faster (e.g., about 1 µm/hour to about 30 µm/hour, or about 30 µm/hour or faster) to any desired thickness (e.g., an epilayer thickness of greater than about 100 µm, from about 1 µm to about 100 µm, or smaller than about 1 µm). In one particular embodiment, growth can be achieved in a hotwall CVD chamber at a growth temperature of about 1400° C. to about 2000° C. (e.g., about 1500° C. to about 1800° C.). The resulting epitaxial film include SiC, and can, in one particular embodiment consist essentially of SiC (e.g., consist of SiC).

The method also improves crystal quality by adding the silicon tetrafluoride gas partially to other precursor gases (e.g. propane, methane, silane, dichlorosilane etc.) during the growth.

Although the presently disclosed epitaxial growth utilizing fluorine chemistry can be performed without any pretreatment on the substrate (or buffer epilayer, if present) (described in section II below), the combination of the use of the fluoride gas chemistry during SiC epilayer growth and the substrate pretreatment with the molten KOH-related mixture is extremely effective for growth of good quality SiC epitaxial films as a platform to grow other materials such as graphene and semiconductors including compound semiconductors, including but not limited to GaN, AlGaN, and InN.

Clearly, the use of fluoride gas chemistry in CVD growth is effective in growing good quality SiC epitaxial films at different growth rates and films of different thicknesses, and different doping concentrations and doping types (selected from the group consisting of N$^+$, N$^-$, P$^+$, P$^-$ and semi-insulating), using the principle of site competition epitaxy or by adding specific dopant species (e.g., nitrogen, aluminum, boron etc.). Pretreatment of the SiC substrate by molten KOH-related mixture etching prior to the growth with a fluorine source present (e.g., via SiF$_4$) further enhances the BPD conversion, reduces stacking faults, and improves the crystal quality further.

In general, any combination of source gases can be utilized to provide fluorine atoms, silicon atoms, and carbon atoms within the CVD chamber during epitaxial growth. In one embodiment, at least two source gases can be introduced into the CVD chamber such that, upon decomposition at the deposition temperature, fluorine atoms, carbon atoms, and silicon atoms are present in the CVD chamber. The relative amounts of each component can also be selectively controlled as desired, according to the deposition conditions (e.g., temperature, flow rate, desired growth rate, etc.). The amount of fluorine atoms in the system is generally enough to inhibit and/or prevent formation of Si—Si bonds in the deposition conditions. Further, in another embodiment, a single precursor gas containing Si, C, and F, such as methyltrifluorosilane, can be used as the source gas, with or without any additional source gas(es) present in the chamber.

A. A Fluorinated Si-Source Gas and a Carbon-Source Gas

As stated, an epitaxial layer of SiC can be grown via CVD, in one embodiment, utilizing a fluorinated Si-source gas in combination with a carbon-source gas. Particularly suitable fluorinated Si-source gas include, but are not limited to, SiH$_x$F$_y$ where x=0, 1, 2, or 3; and y=4−x. For example, silicon tetrafluoride, SiF$_4$ (x=0), can be utilized as the fluorinated Si-source gas.

Although any suitable gas containing carbon can be used as the carbon-source gas, one particularly suitable class of carbon-source gases for this embodiment includes hydrocarbon gasses (e.g., propane, ethylene, or mixtures thereof).

The volumetric ratio of the fluorinated Si-source gas to the carbon-source gas can vary depending on the deposition conditions in the CVD process, but is, in most embodiments generally sufficient to grow a SiC epilayer that has close to a 1:1 stoichiometric ratio of Si to C. In general the ratio of the gas flow rates (measured in standard cubic centimeter per minute or sccm) is kept in such a way that the ratio of the number of C and Si atoms is about 1:1 for the growth conditions mentioned earlier. However, good epilayers are also grown for different C/Si ratios (e.g. from about 0.3 to about 1.6, such as 0.3, 0.6, 0.9, 1, 1.2, 1.4, 1.6).

In such a system, a sufficient amount of fluorine may be present without any other silicon source and/or fluorine source required in the system. Thus, in one embodiment, growth can be achieved in a CVD chamber that is substantially free from any other silicon source gas and/or any other fluorine source gas.

However, additional source gasses (e.g., an additional Si-source gas and/or an additional C-source gas and/or an additional F-source gas) can also be present, but is not required in this embodiment.

B. A Si-Source Gas, a F-Source Gas, and a Carbon-Source Gas

In this embodiment, a silicon source gas is used in combination with a fluorine source gas (e.g., HF) and a carbon-source gas. In this embodiment, the relative amounts of silicon and fluorine in the system (i.e., the ratio of silicon to fluorine) can be selectively controlled as desired.

The silicon source gas can be fluorinated (e.g., as discussed above with reference to embodiment A) or can be free of fluorine, such as silane (SiH$_4$)). Suitable silicon source gas that are free of fluorine include, but are not limited to, hydrosilanes (e.g., comprises Si$_x$H$_y$, where x is 1, 2, 3, or 4; and y=2(x)+2), chlorinated silane gases (e.g., dichlorosilane, trichlorosilane, tetrachlorosilane), chlorinated carbon-silicon source gases (e.g., methyltrichlorosilane (CH$_3$SiCl$_3$)), or mixtures thereof.

Although any suitable gas containing carbon can be used as the carbon-source gas, one particularly suitable class of carbon-source gases for this embodiment includes hydrocarbon gasses (e.g., propane, ethylene, or mixtures thereof).

Additional source gases (e.g., an additional Si-source gas and/or an additional C-source gas and/or an additional F-source gas) can also be present, but is not required in this embodiment.

C. A combination Si- and C-Source Gas, and a F-Source Gas

In this embodiment, a combination Si- and C-source gas is used in combination with a fluorine source gas (e.g., HF). In this embodiment, the relative amounts of silicon and fluorine in the system (i.e., the ratio of silicon to fluorine) can be selectively controlled as desired.

The Si- and C-source gas can be fluorinated (e.g., methyltrifluorosilane), or can be free of fluorine, such as methyltrichlorosilane ($CH_3SiCl_3$).

Additional source gases (e.g., an additional Si-source gas and/or an additional C-source gas and/or an additional F-source gas) can also be present, but is not required in this embodiment.

D. A Fluorinated Carbon Source Gas and a Si-Source Gas

In this embodiment, a fluorinated C-source gas is used in combination with a Si-source gas. Particularly suitable fluorinated C-source gas include, but are not limited to, $CH_xF_y$, where x=0, 1, 2, or 3; and y=4−x. For example, tetrafluoromethane, $CF_4$ (x=0), and/or trifluoromethane, $CF_3H$ (x=1), can be utilized as the fluorinated C-source gas.

The silicon source gas can be fluorinated (e.g., as discussed above with reference to embodiment A) or can be free of fluorine, such as silane ($SiH_4$)). Suitable silicon source gas that are free of fluorine include, but are not limited to, hydrosilanes (e.g., comprises $Si_xH_y$, where x is 1, 2, 3, or 4; and y=2(x)+2), chlorinated silane gases (e.g., dichlorosilane, trichlorosilane, tetrachlorosilane), chlorinated carbon-silicon source gases (e.g., methyltrichlorosilane ($CH_3SiCl_3$)), or mixtures thereof.

Additional source gases (e.g., an additional Si-source gas and/or an additional C-source gas and/or an additional F-source gas) can also be present, but is not required in this embodiment.

II. Pretreatment with a Molten Mixture and Subsequent Epitaxial Growth

In one embodiment, a non-destructive pretreatment (or etch) method is generally provided for a SiC substrate with substantially no degradation of surface morphology thereon. After treatment (or etch), the SiC substrate defines a treated (or etched) surface that is particularly suitable for subsequent epitaxial growth to achieve low or zero basal plane dislocation density in the grown epitaxial film. Thus, this substrate pretreatment method allows for non-destructive pretreatment of a SiC substrate to achieve a high BPD conversion rate (e.g., up to and including 100%) in the subsequent epitaxial growth. As such, an epitaxial film can be grown on the surface of the treated SiC substrate such that the BPD density on the grown epilayer is less than 10% of the original BPD density on the surface of the SiC substrate. For example, in one particular embodiment, an epilayer can be grown on the surface of the treated SiC substrate such that the BPD density on the grown epilayer is about 0.0001% to about 1% of the original BPD density on the surface of the SiC substrate, such as about 0.001% to about 0.5%. In certain embodiments, the BPD density on the grown epilayer can be zero.

The molten KOH-related mixture includes, in one embodiment, KOH and a buffering agent. The buffering agent can, in one particular embodiment, be an alkaline earth oxide (such as MgO, GaO, or mixtures thereof). The relative amount of the alkaline earth oxide in the molten KOH-related mixture can be any amount, such as about 1% to about 80% by weight. For example, the relative amount of the oxide in the molten KOH-related mixture can be up to about 25% by weight, such as about 5% to about 20% by weight.

Optionally, another salt can be included in the molten mixture. For example, the KOH-eutectic or near eutectic can generally include KOH and at least one another salt (e.g., NaOH, $KNO_3$, $Na_2O_2$, or a mixture thereof) with any possible weight ratio, such as about 1:4 to about 4:1 in terms of the weight ratio of KOH to the other salt(s) (e.g., about 1:2 to about 2:1). However, the relative amounts can be varied depending on the composition of the other salt(s) present in the molten mixture. For example, the molten mixture can, in one particular embodiment, include KOH and NaOH in a relative amount of about 1:4 to about 4:1 in terms of weight ratio. Alternatively, the molten mixture can, in another particular embodiment, include KOH and $KNO_3$ in a relative amount of 1:20 to 5:1 in terms of weight ratio.

The components of the mixture (i.e., KOH, buffering agent (e.g., MgO, GaO, or a mixture thereof), and one or more optional additional salt(s) (e.g., NaOH, $KNO_3$, $Na_2O_2$, or a mixture thereof)) are melted together to form a suspension mixture. For instance, in most embodiments, the buffering agent (e.g., MgO, GaO, or a mixture thereof) is not melted, but is a fine powder dispersed in molten KOH liquid to form a suspension. For example, the molten mixture may be melted at temperature of about 170° C. to about 800° C. (e.g., about 500° C. to about 600° C.), and applied onto the surface of the substrate. Such melting can be carried out in any suitable container (e.g., a nickel crucible).

The molten KOH-related mixture can be applied onto the surface of the SiC substrate (e.g., via soaking the SiC substrate in the molten mixture) for a certain treatment duration to form a treated surface prior to any epitaxial growth. For example, the duration of treatment with the molten KOH-related mixture of the surface of the SiC substrate can be relatively short. In one embodiment, the treatment duration is about 1 minute to about 60 minutes, such as about 2 minutes to about 5 minutes. However, the treatment duration can be varied depending on the composition of the molten mixture and/or the temperature of the mixture. That is, the relative amounts of the each component in the molten KOH-related mixture can be varied, while still obtaining similar results by adjusting treatment duration. For example, a higher KOH concentration in the mixture and/or a higher temperature of the mixture can lead to a shorter treatment duration.

After the pretreatment, the KOH-related mixture can be removed from the surface of the SiC substrate to reveal the treated surface thereon. Optionally, a regular RCA cleaning process can be performed on the treated substrate prior to loading the substrate in the CVD chamber for epitaxial growth.

In one particular embodiment, the treated surface can be substantially free from etch pits of dislocations thereon, while still preserving high BPD conversion rate in the subsequent epigrowth. By "substantially free" it is meant that nearly no visible pits or any other features can be seen on the treated surface using optical microscopy at ×1000 magnification. As such, this treatment method can be referred to as a non-destructive treatment.

Epitaxial growth on the treated surface causes a reduced BPD density on the subsequent epitaxial film that can be less than 10% of the original BPD density on the substrate, while preserving the surface morphology of thereon. For example, the epilayer BPD density can be less than 1% of the original BPD density on the substrate, such as less than 0.5%. In one particular embodiment, the epilayer BPD density is less than 0.1% of the original BPD density on the substrate. For example, an epilayer can be grown on the surface of the treated SiC substrate such that the BPD density on the grown epilayer is about 0.0001% to about 1% of the original BPD density on the surface of the SiC substrate, such as about 0.001% to about 0.5%. In one particular embodiment, the epitaxial film is free of basal plane dislocations therein.

Additionally, the treated surface can have a relatively smooth surface, such as having RMS surface roughness that is less than about 1 nm, such as less than about 0.5 nm (e.g., such as about 0.36 nm). The epitaxial film grown on the treated surface can also preserve this relatively smooth surface, such as having RMS surface roughness that is less than 1 nm for 8° SiC epitaxy or less than 4 nm for 4° SiC epitaxy (e.g., such as about 0.6 nm at a 15 µm thick 8° SiC epilayer). The epitaxial film grown on the treated surface can be free of any pits inherited from the substrate treatment when a relatively short duration of treatment is employed on the substrate. As such, this process can yield an epilayer surface that, in certain embodiments, need not be polished for further use. Thus, this methodology can save valuable processing time and materials.

Figure 13:
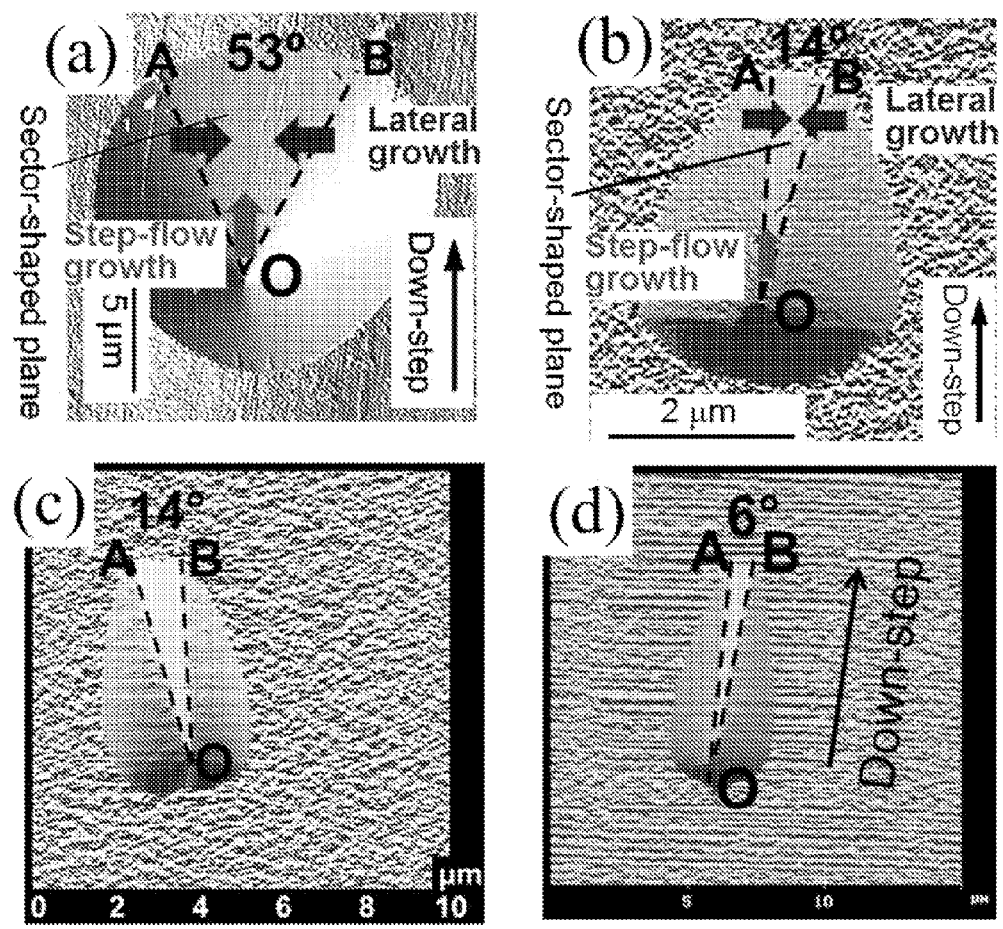
FIG. 13 shows the mechanism of BPD conversion in epitaxial growth on pure KOH and molten KOH—NaOH—MgO mixture etched surfaces. Smaller sector open angle ∠AOB in a BPD etch pit leads to easier pinching off of the step-flow growth by lateral growth, resulting in a higher BPD conversion rate.

The mechanism of BPD conversion in epigrowth on the treated/etched substrate is illustrated in FIG. 13. After pre-treatment of the SiC substrate (4° or 8°) with the molten KOH-related mixture described above, a sector-shaped plane (marked AOB in FIG. 13) is generated at the bottom of the BPD etch pit, roughly paralleling the basal plane. Epitaxial growth of SiC on the off-axis surface is a step-flow growth mechanism. If the lateral growth (across line segments OA and OB) overcomes step-flow growth (starting from vertex O) in the etch pit (i.e. the lateral growth pinches off the step-flow growth inside the etch pit), the path for the BPD propagation in the basal plane is "blocked" and thus the BPD line will redirect perpendicularly to the basal plane, becoming a TED. On the molten KOH-related mixture etched substrate surface, the sector opening angle of BPD etch pit)($\angle AOB=14°$ (as shown in FIG. 13 (b) on 8° SiC substrate and FIG. 13 (c) on 4° substrate) is much narrower than that on the molten pure KOH etched substrate surface ($\angle AOB=53°$)(as shown in FIG. 13 (a)). Therefore, pinching off of the step-flow growth (i.e. merging of OA and OB) by lateral growth is significantly enhanced, resulting in a very high BPD conversion rate. Furthermore, on the molten KOH-related mixture etched buffer epilayer surface, the sector open angle $\angle AOB$ is only 6° (as shown in FIG. 13 (d)) in the BPD etch pit, so pinching off of the step-flow growth is always obtained, resulting in 100% BPD conversion.

In the present invention, formation of large etch pits in not necessary. Formation of sufficiently large BPD etch pit, as shown in FIG. 13 (b)-13(d) was only for defect mapping by optical microscope to study the influence of etch pit size on BPD conversion and to investigate the BPD conversion mechanism. It was found that the shape of BPD etch pit is independent of its size and hence the BPD conversion rate is not influenced by the size of etch pit. In the practical application, non-destructive pretreatment of the substrate is realized by a short-time treatment, generating very small etch pits invisible by optical microscope at ×1000 magnification. The subsequent epitaxial growth preserves the high BPD conversion rate due to the above mechanism. And due to the short-time treatment, the morphology of sample surface is not degraded.

Figure 10:
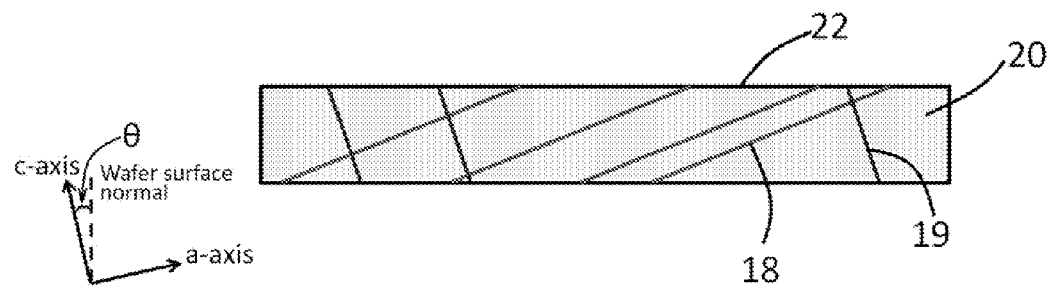
FIG. 10 shows a SiC substrate wafer off-axis cut from a boule (e.g., the boule shown in FIG. 9). When the boule is cut into off-axis (0001) substrate wafers, such as at angles of 4° or 8° that are currently commonly used for SiC epitaxial growth, the dislocations on the basal plane intersect the substrate surface.
Figure 11:
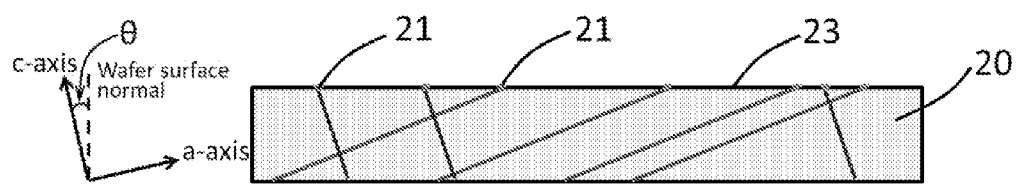
FIG. 11 shows the SiC substrate of FIG. 10 after treatment by molten KOH—NaOH—MgO mixture according to one embodiment of presently disclosed. Defect delineation or severe etching of the substrate (or visible etch pit formation) is not necessary. The size of the etch pit has no influence on the efficacy of BPD conversion in the subsequent epitaxial growth. Therefore, etch pits can be small enough that are not even observed by Nomarski optical microscope at ×1000 magnification, and there is no degradation of the morphology on the entire substrate surface.
Figure 12:
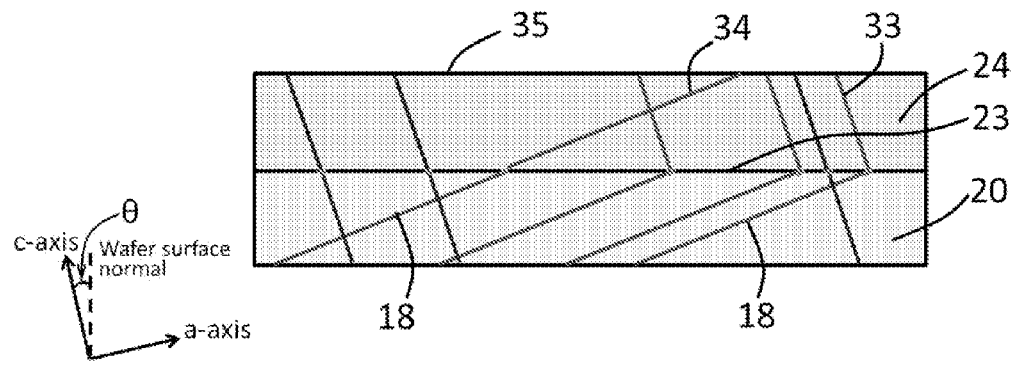
FIG. 12 shows an epitaxial film grown on the molten KOH—NaOH—MgO mixture treated surface of the SiC substrate shown in FIG. 11. The epitaxial film is ready for device fabrication. Post polishing or dry etching is not needed, and there is no limit for the thickness of the grown epilayer.

FIGS. 9, 10, 11, and 12 sequentially show an exemplary method of forming a SiC grown boule (FIG. 9), cutting an off-axis SiC substrate wafer from the boule (FIG. 10), treating the SiC substrate wafer with the molten mixture to form a treated surface (FIG. 11), and forming an epilayer on the surface of a SiC substrate wafer (FIG. 12).

Figure 9:
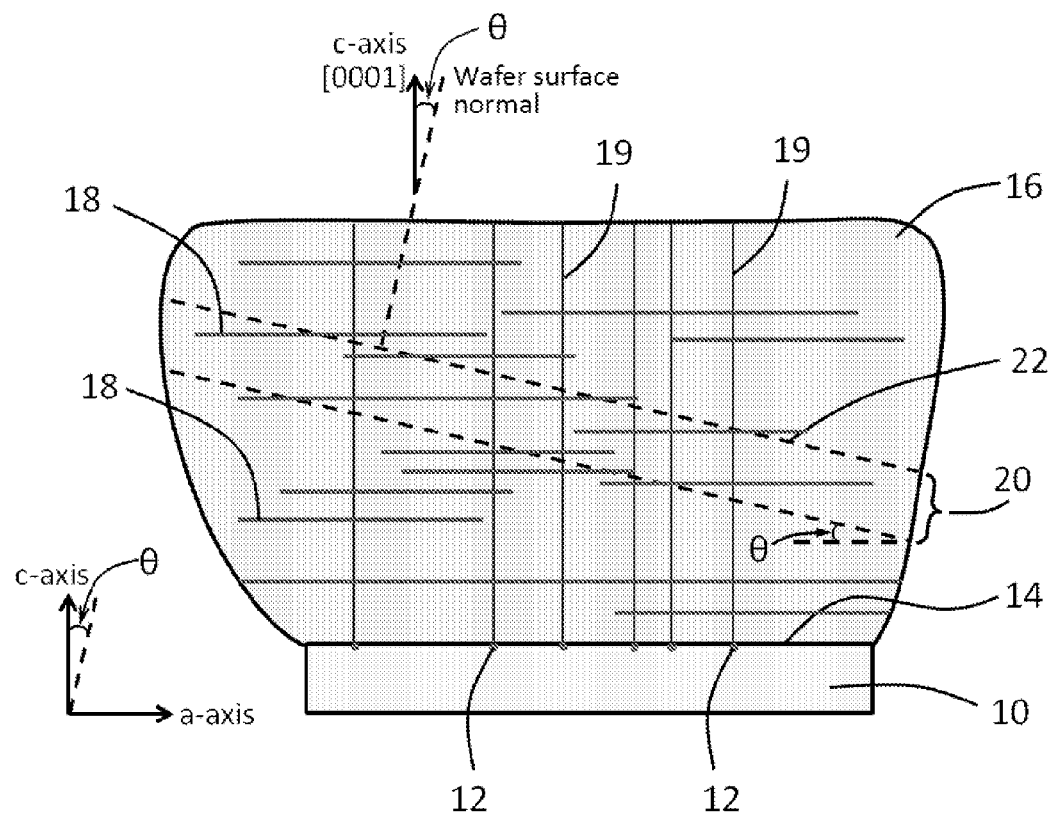
FIG. 9 shows schematically a boule (or bulk crystal) seeded from a SiC seed substrate. Also shown in the figure with dashed lines, an off-axis wafer harvested from the boule, which is used as substrate for epitaxial growth. The boule can be cut into on-axis (0001) or off-axis (0001) substrate wafers.

Referring to FIG. 9, a seed substrate (10) is shown having defects (12) on its surface (14). A bulk crystal (or boule) (16) of SiC is shown grown on the surface 14 of the seed substrate 10. The bulk crystal (boule) 16 has basal plane dislocations (BPDs) (18) lying in the basal plane {0001} in random orientations and threading dislocations (19) oriented in the direction of c-axis.

The SiC boule 16 can be cut to form a SiC substrate wafer configured for epitaxial growth. Generally, the boule 16 is cut at an angle (θ) from the basal plane that is about 1° to about 10° (e.g., about 3° to about 8°). The off cut of the substrate (20) results in a surface (22) with atomic steps. During CVD growth, the adsorbed precursors migrate on the substrate surface and are incorporated into the epilayer at step edges. This is called "step-flow epitaxy". Since the SiC substrate 20 is cut at the angle (θ) from the basal plane, both the basal plane dislocations 18 and the threading dislocations 19 intersect the surface 22 of the SiC substrate 20, as shown in FIG. 10. These dislocations can propagate into the subsequent epilayer and hence can influence the device performance. It is noted that these dislocations are not revealed unless the surface 22 is performed sufficient KOH or KOH-eutectic defect selective etching. The total number of BPDs 18 on the surface 22 of the SiC substrate 20 in a certain surface area defines the original BPD density on the substrate. For example, in most SiC substrates, BPDs can exist with a density of about $10^3$ to about $10^4$ cm$^{-2}$.

In regular SiC epitaxial growth on the 8° untreated substrate using DCS as the Si-precursor, about 99.0% of the BPDs on the original substrate surface are converted to TEDs, resulting in about 200 cm$^{-2}$ BPDs on the epilayer surface. However, this number is still too high for commercial device production.

According to one particular embodiment of the present invention, the surface 22 of the SiC substrate 20 in FIG. 10 is treated using the molten mixture as discussed above. Referring to FIG. 11, at the non-destructive condition, the treated surface (23) has very small "etch pits" (21) (which are not observed by optical microscope) generated at the intersecting point between dislocations 18 and 19 and surface 22. Using a scanning electron microscope (SEM) at the magnification of 100 k, only a few threading screw dislocations (TSDs) with diameter less than 400 nm are observed on surface 23; TED and BPD etch pits 21 exist but are not observed by SEM due to the very small and shallow pits. Additionally, the treated surface 23 has no degradation of morphology on the entire surface (such as RMS of about 0.36 nm).

Referring to FIG. 12, an epilayer 24 can be grown on the treated surface 23 of the SiC substrate 20, according to any suitable method discussed in greater detail below. For example, the epilayer 24 can be grown via a CVD process using a carbon source gas (e.g., a hydrocarbon, such as propane) as the carbon precursor and a Si-source gas (e.g., silane, a chlorinated silane, (e.g., dichlorosilane), or a fluorinated silane (e.g., silicon tetrafluoride)) as the silicon precursor. When dichlorosilane is used as the silicon precursor, in epitaxial film 24, about 99.9% of the BPDs 18 on the original substrate surface 23 were shown to be converted to TEDs (33) during the initial stage of the epitaxial growth (close to the epilayer/substrate interface). The rest substrate BPDs propagate into the epilayer, resulting in a BPD (34) density on the epilayer surface less than 20 cm$^{-2}$. When silicon tetrafluoride was used as the silicon precursor, zero-BPD is achieved in the epitaxial film 24 indicating that all of the BPDs 18 on the original substrate surface were converted to TEDs 33.

The above methods are discussed with respect to treatment of the actual surface of the substrate (i.e., the molten KOH-related mixture is applied directly onto the surface of the SiC substrate). However, in another embodiment, the molten KOH-related mixture can be applied onto a buffer epilayer that is present on the surface of the SiC substrate. That is, prior to applying the molten KOH-related mixture, the buffer epilayer (of any doping concentration; n or p type) can be grown on the surface of the SiC substrate according to any of the methods disclosed with respect to the "main" epilayer, since the epi-buffer layer generally includes SiC in most embodiments.

When a buffer epilayer is present on the substrate's surface, the "main" epilayer is grown on the buffer epilayer after the pretreatment of the buffer epilayer by the molten KOH-related mixture at the condition described above. In the presence of the buffer epilayer, zero-BPD was obtained on the main epilayer using CVD with any combination of carbon source gas and Si-source gas.

In all of the above methods, there is little-to-no degradation of morphology on the epilayer surface (35), so there is no need to perform post polishing and dry etching for the grown epilayer 24 for device fabrication. Without wishing to be bound by any particular theory, it is believed that the reduction of dislocation density and/or stacking fault density in the grown epitaxial films can be attributed to the non-destructive pretreatment of the SiC substrate and the use of fluorinated precursor(s).

Through epitaxial growth, an epitaxial film can be grown on the treated surface of the SiC substrate according to known methods, including but not limited to chemical vapor deposition ("CVD"). In one particular embodiment, homoepitaxial films can be grown as a SiC epilayer, such as using a CVD process with a carbon-source gas (e.g., a hydrocarbon gas such as propane) as the carbon precursor and Si-source gas (e.g., a chlorinated silane such as dichlorosilane or fluorinated silane such as Silicon tetrafluoride ($SiF_4$)) as silicon precursor. However, in other embodiments, heteroepitaxial films can be grown on the SiC substrate as desired, including but not limited to graphene, AlInGaN epilayers and derivatives thereof (e.g., GaN, AlN, GaN, and combinations thereof) or to the bulk growth of SiC, GaN, AlN and derivatives thereof.

EXAMPLE 1

Fluorine Chemistry

Experiments were conducted in a hot wall CVD reactor. Silicon tetrafluoride ($SiF_4$) was used as the gas precursor for silicon source as well as conventional gases (silane and dichlorosilane) for comparisons. Propane gas was used as the carbon source, whereas hydrogen gas was used as the carrier gas. Growth temperature was kept at 1550° C. and the reactor pressure was kept fixed at 300 Torr. The C/Si ratio was maintained at 1. Commercially available 4H—SiC (Si face, 8° or 4° off cut towards [11$\bar{2}$0] direction) substrates were used, without any surface pretreatment.

A novel gas delivery tube system (gas injector) was used to visualize the parasitic deposition in the gas delivery tube. This design was an effective tool to identify the location at which gases start decomposing in the injector tube by the observation of parasitic depositions. In this scheme, the gas delivery tube is axially split into two halves, which can be assembled together for epitaxial growth. The scheme is shown in FIG. 1 where the split part of the gas delivery tube can be seen as PQ in the CVD reactor. These split halves are assembled together to form a complete tube before growth and can be separated again after the growth for observation. Inside the injector tube, a temperature gradient was formed, with two temperature points shown in FIG. 2, with the susceptor (i.e., the wafer holder) shown in FIG. 1 as the box below the end of the injector tube (Q) heated to 1550° C.

Figure 2:
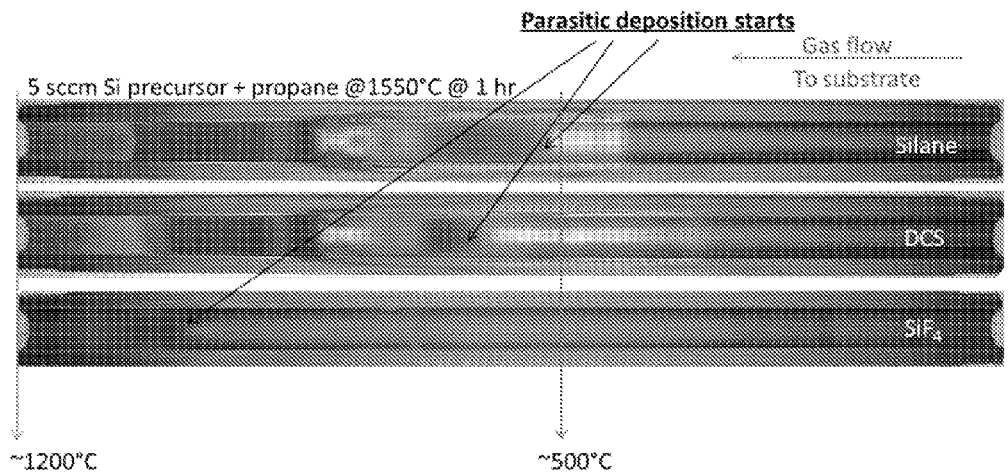
FIG. 2 shows axially split gas injector tubes after use in a hotwall CVD furnace, as diagramed in FIG. 1, comparing parasitic deposition of different Si-source gases: silane, DCS, and $SiF_4$.

The inside image of one half of the split tube before and after the growth is shown in FIG. 1. Here it can be seen that the tube is clean before the growth. However, after the growth, parasitic deposition, which was a composition of different Si and C compounds, can be clearly seen. The gas decomposition condition in the tube can be roughly estimated from the locations of parasitic deposition regions in the tubes. This technique was specially proven to be beneficial for comparing different gas chemistries in a CVD reactor (FIG. 2). This process was very useful to visualize the gas decomposition condition in the reactor for growth optimization.

Figure 3:
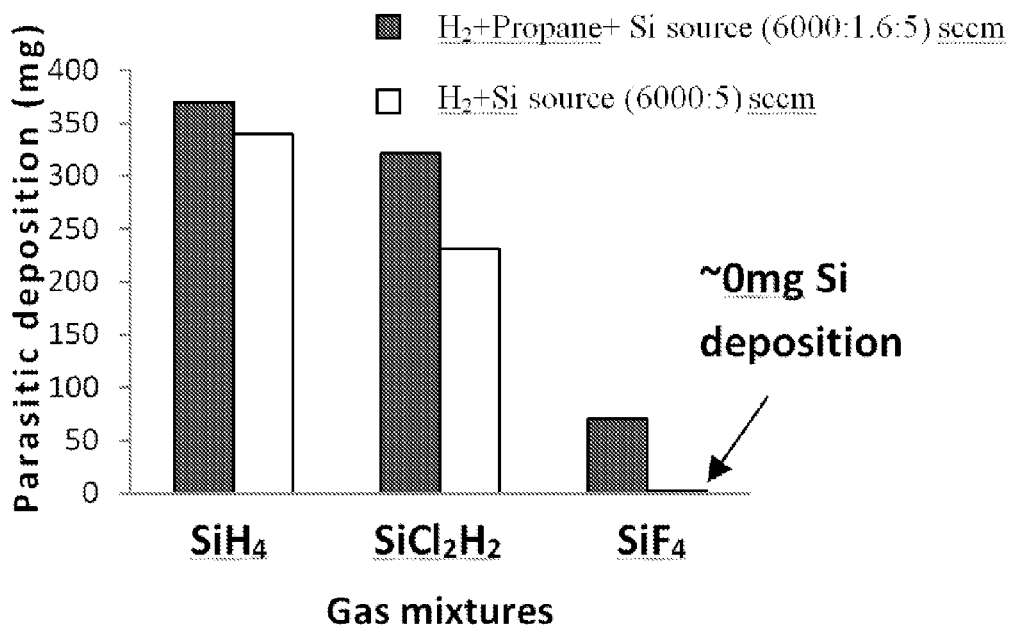
FIG. 3 shows the mass measurement of parasitic depositions after 1 hour in a hotwall CVD furnace, as diagramed in FIG. 1, using (a) a Si-precursor gas and $H_2$ and b) a Si-precursor gas, propane, and $H_2$.

The parasitic deposition and gas decomposition using $SiF_4$, in comparison to conventional gases, was demonstrated in FIG. 2 using the aforesaid split tube scheme of FIG. 1. In FIG. 2, three split gas injector tubes are shown after the epitaxial growths with different gases using same growth conditions. A gas mixture of the silicon precursor gas ($SiH_4$/$SiCl_2H_2$/$SiF_4$), propane and hydrogen, entered the cold end of the tube (right) and exited to the hot end (left) towards the substrate. During this travel, gas decomposition took place and material deposited on the tube wall from the decomposed gas. It can be clearly seen in FIG. 2 that silicon tetrafluoride ($SiF_4$) decomposed much later in the tube and produced the least amount of deposition on the tube wall compared to silane ($SiH_4$) and dichlorosilane ($SiCl_2H_2$). The measured weights of these depositions were shown in a bar graph in FIG. 3.

Approximately ~0 mg of Si deposition (compared to 341 mg for $SiH_4$ and 235 mg for DCS) was measured for the case of $SiF_4$ without propane indicating Si deposition-free condition in the reactor for $SiF_4$-essential for high quality growth in a clean reactor environment (implying minimum Si pyrolysis and minimum gas phase nucleation). On the other hand, with propane addition, only 71 mg of parasitic deposition took place on the gas injector tube for $SiF_4$ compared to 370 mg and 323 mg respectively for $SiH_4$ and DCS (no significant difference was observed for DCS and $SiH_4$ gases). This suppression of parasitic deposition and gas phase nucleation using $SiF_4$ not only improved the crystal quality by minimizing Si and SiC parasitic particles originating from the reactor parts but also increased the re-usability of the reactor parts, which is an important factor to reduce the growth cost. This is also an important consideration for long duration growth.

A significant reduction of parasitic deposition using $SiF_4$ was indicative of a reduced gas phase nucleation condition considering that a reduced gas phase reaction (molecule-molecule interaction) was also a condition for reduced parasitic deposition (molecule-solid interaction) and vice versa. Thus, it is believed that the use of $SiF_4$ achieves a Si droplet-free environment, which is not possible to achieve using conventional gases (e.g., silane, chlorinated silicon precursors, etc.) under the same conditions.

TABLE 1

Comparison of epilayer quality using various precursors for (T = 1550° C., P = 300 torr, $H_2$ flow rate = 6 slm, C/Si = ~1 and growth duration = 1 hr; substrate $E_2(TO)/E_1(TO)$ or 4H/3C peak ratio = ~32, substrate doping = ~1 × $10^{19}$ $cm^{-3}$ N-type and substrate XRD FWHM = ~20 arcsec).

| Si precursor | Si gas flow rate (sccm) [a] | Growth rate (μm/hr) | Raman $E_2$ to $E_1$ (4H/3C) Peak ratio | Doping ($cm^{-3}$) | Surface roughness R.M.S. (nm) [b] | XRD FWHM | Particle density 100-400 μm ($cm^{-2}$) | Particle density 30-100 μm ($cm^{-2}$) | Particle density 10-30 μm ($cm^{-2}$) | Pit density 1 μm-3 μm ($cm^{-2}$) |
|---|---|---|---|---|---|---|---|---|---|---|
| $SiH_4$ | 5 | 7 | ~30 | 1 × $10^{17}$ p | ~0.5 nm | ~20 | 20 | ~50 | ~200 | ~3 × $10^5$ |
| DCS | 5 | 10 | ~50 | 5 × $10^{16}$ p | ~0.4 nm | ~12 | 0 | ~45 | ~100 | ~2 × $10^3$ |
| $SiF_4$ | 10 | 30 | ~60 | 1 × $10^{15}$ n | ~0.3 nm | ~7.5 | 0 | 0 | ~5 | ~50 |

Figure 4A:
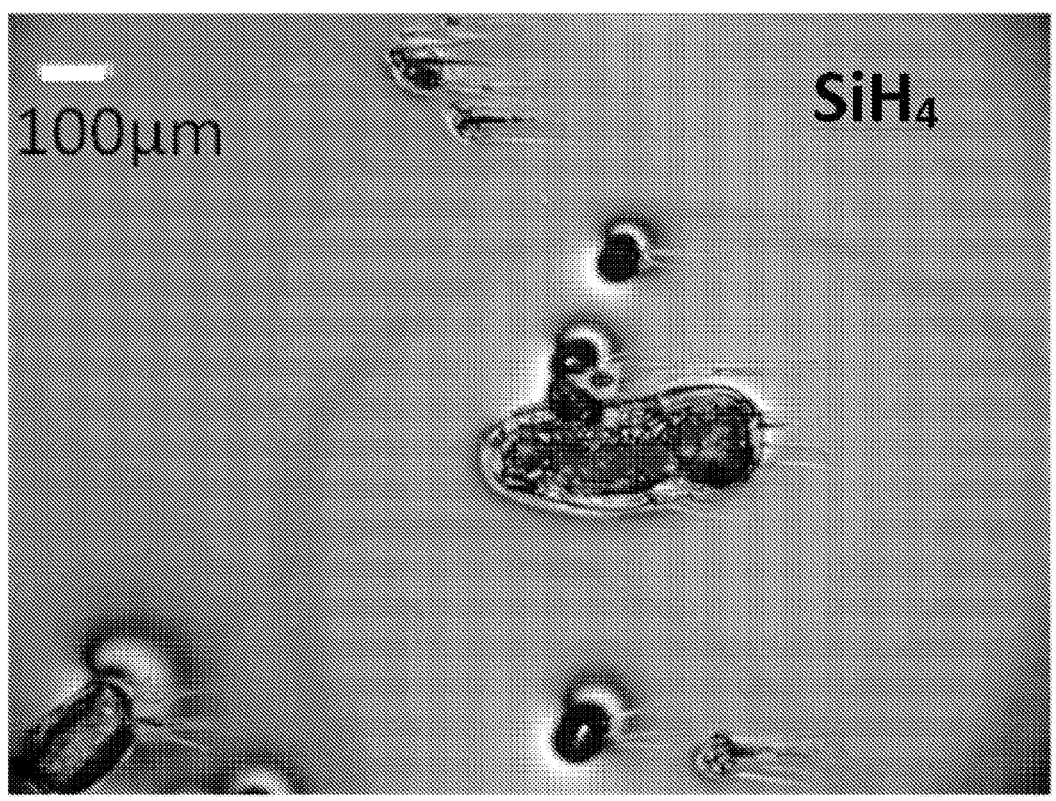
FIG. 4a shows particles on a SiC epilayer surface grown at 7 μm/hr at 5 sccm of $SiH_4$ (T=1550° C., P=300 torr, $H_2$ flow rate=6 slm).
Figure 4B:
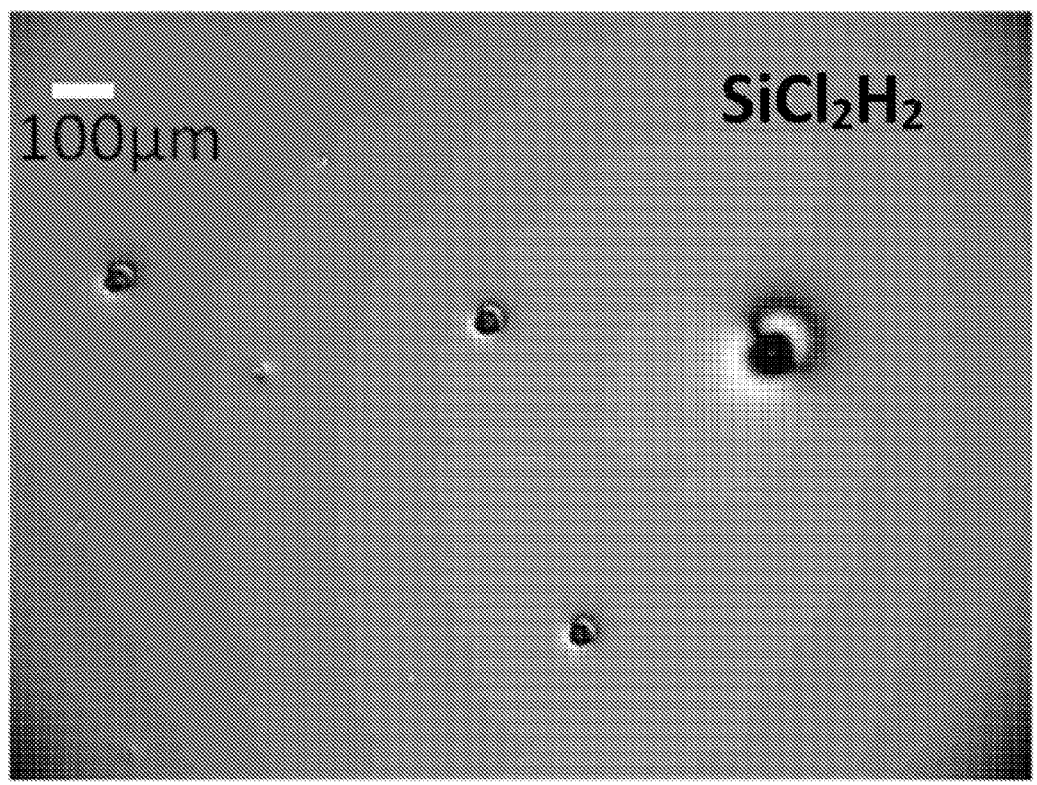
FIG. 4b shows particles on a SiC epilayer surface grown at 10 μm/hr at 5 sccm of DCS (T=1550° C., P=300 torr, $H_2$ flow rate=6 slm).
Figure 4C:
FIG. 4c shows particles on a SiC epilayer surface grown at 30 μm/hr at 10 sccm of $SiF_4$ (T=1550° C., P=300 torr, $H_2$ flow rate=6 slm).

[a] epilayer surface significantly degrades with particulates at these flow rates (5 sccm) for silane and DCS. However, growth is improved due to suppression of particulate using $SiF_4$ even for higher flow rates (10 sccm). FIGS. 4a, 4b, and 4c show the growth surfaces formed at these flow rates using $SiH_4$, DCS, and $SiF_4$, respectively.
[b] excluding the particulates in the epilayers.

A large number of particle related defects were observed for the growth using $SiH_4$ at 5 sccm for one hour growth at a growth rate of ~7 μm/hr, as shown in FIG. 4a. These large particles were directly related to the degradation of the reactor parts due to heavily deposited Si and their consequent exfoliation. Long duration growth with good morphology was not possible in this case. The density of particle related defects is shown in Table 1. Growth using DCS exhibited somewhat lower density of particles (due to less parasitic deposition). Long duration growth with good quality epilayers was still not possible even at this growth condition due to these particles. On the other hand $SiF_4$ significantly suppressed gas-phase nucleation and parasitic deposition at the same conditions, and a significantly higher growth rate was achieved by increasing the mass transport without generating particles. In this cleaner growth environment, long duration growth with good quality epitaxy is possible and films greater than 120 μm thicknesses were grown. A comparison of particulates generated during growth using three different Si precursors is shown in Table 1.

Homoepitaxial films were grown using silicon tetrafluoride ($SiF_4$) for the first time in a Si droplet-free condition. Epitaxial films with 10 μm, 30 μm, 60 μm and 120 μm thicknesses were grown. Very smooth surface (RMS roughness ~0.3 nm) was observed even for a ~60 μm thick epi grown at 30 μm/hr. The surface roughness did not increase significantly for thicker (~120 μm), long grown (4 hours) epilayers (RMS roughness ~0.5 nm vs. ~0.3 nm).

Figure 5:
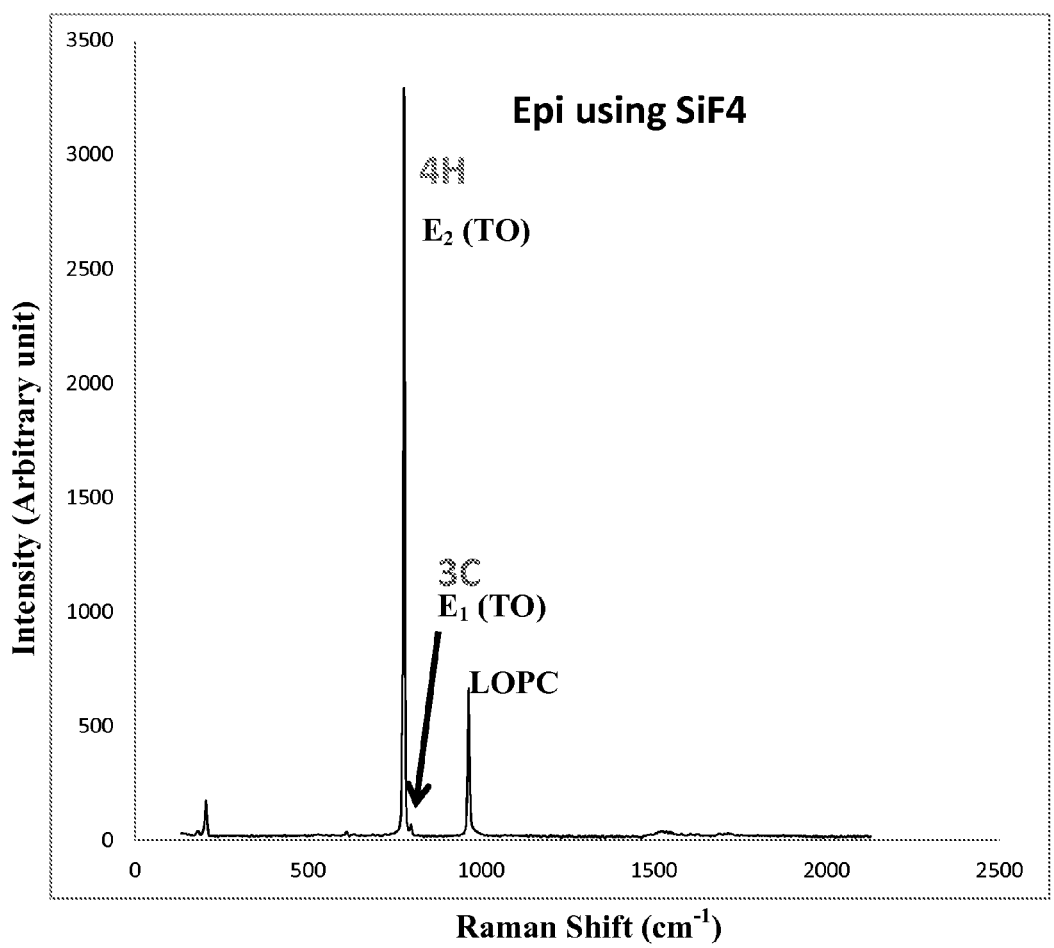
FIG. 5 shows Raman spectrum of a thick (120 μm) epilayer grown using $SiF_4$ in a hotwall CVD furnace, as diagramed in FIG. 1 according to Example 1.

As shown in FIG. 5, Raman spectra of a 120 μm thick Epilayer was examined and showed that the ratio between 4H peak (at wave number 776) and 3C peak (at wave number 796) as an indication of the polytype uniformity for the case where the epitaxial film was grown on a 4H substrate. Negligible height of 3C peak compared to the 4H peak height demonstrated very low formation of 3C polytype in the epilayer. A peak ratio (4H/3C) of ~60 (Table 1) indicated excellent polytype uniformity (4H) for the growth using $SiF_4$.

Figure 6:
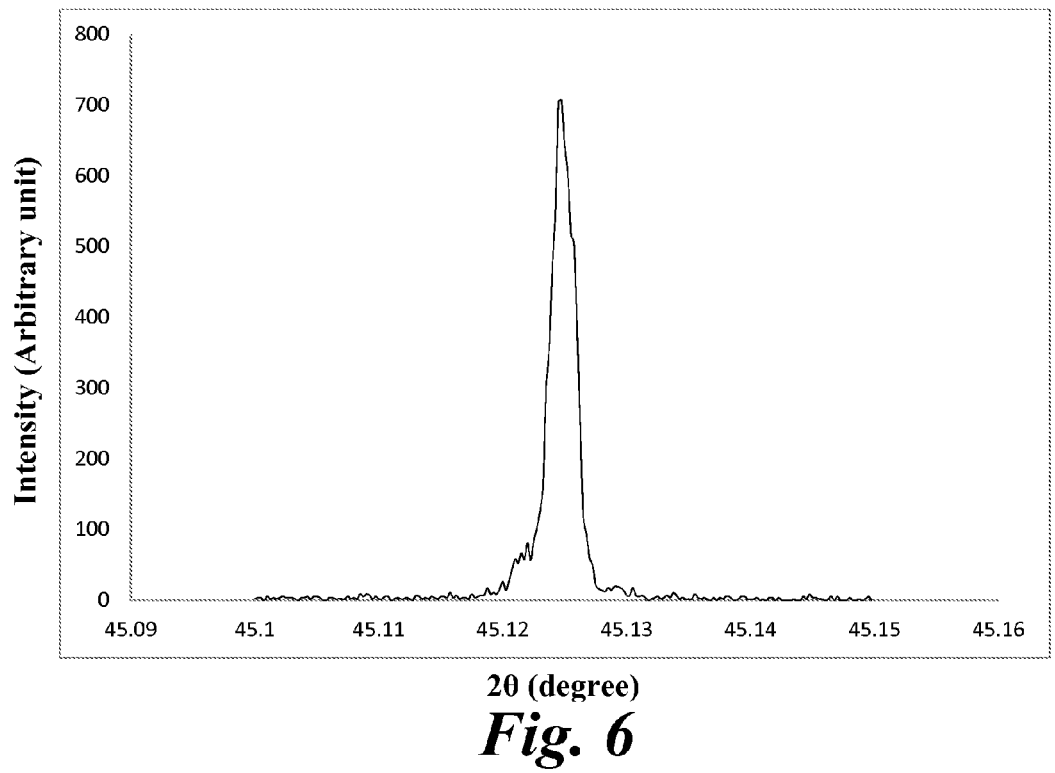
FIG. 6 is an X-ray rocking curve showing FWHM of 7.5 arcsec of an epilayer grown using $SiF_4$ according to Example 1, which indicates high quality crystal.

X-ray rocking curve was obtained to measure the crystalline quality of the epi grown using $SiF_4$. A FWHM of a 60 μm thick sample was found to be ~7.5 arcsec (FIG. 6), which indicated very high crystal quality.

Figure 7:
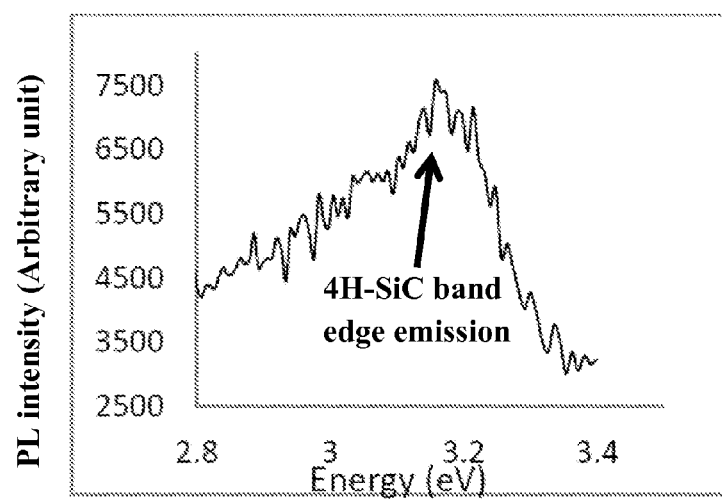
FIG. 7 shows a PL spectra with a 4H—SiC band edge peak at 3.17 eV of an epilayer grown using $SiF_4$ according to Example 1.

The room temperature photoluminescence (PL) spectra (FIG. 7) showed the typical exciton/band edge peak for 4H SiC at 3.17 eV (391 nm), indicating no change of bandgap of the SiC epilayer grown using fluorine chemistry. Molten KOH etching of the epilayer demonstrated very low density of BPDs. For an 8° off cut substrate a density of ~20 $cm^{-2}$ was observed, and for a 4 degree off cut substrate a density of ~5 $cm^{-2}$ was observed.

EXAMPLE 2

Substrate Surface Pretreatment

The substrate was commercially obtained 4H—SiC wafer with 8° off-axis towards [11$\bar{2}$0] direction with the Si-face chemical mechanical polished. The substrates were treated by molten KOH-related mixture of (e.g., KOH—NaOH—MgO at 35:50:15 wt %) for different durations (2-45 min). Epitaxial growth was carried out in a home-built chimney CVD reactor at 1550° C. and 80 Torr, using propane and dichlorosilane as precursors. The doping of the epilayer is ~1×$10^{15}$ $cm^{-3}$ n-type was controlled by C/Si ratio. After growth, all the samples were etched by the same etchant to delineate the defects on the epilayers.

TABLE 2

Sample pretreatment condition and defect density on the epilayers grown on 8° SiC substrates[a].

| Sample No. | Substrate treatment duration | Etch pit size on the substrate | Epilayer thickness (μm) | BPD density on the epilayer ($cm^{-2}$) |
|---|---|---|---|---|
| 1 | No | — | 6 | 183 |
| 2 | No | — | 6 | 150 |
| 3 | No | — | 6 | 232 |
| 4 | 2 min | Invisible[b] | 6 | 20 |
| 5 | 12 min | <1 μm | 6 | 11 |
| 6 | 25 min | ~1.5 μm | 6 | 22 |
| 7 | 45 min | ~4 μm | 6 | 15 |
| 8[c] | 2 min | Invisible[b] | 0.5 | 19 |

[a]Typical BPD density on 8° SiC substrate is 2.8 × $10^4$ $cm^{-2}$.
[b]The etch pits are "invisible" under a Nomarski optical microscope at the magnification of ×1000.
[c]Sample #8 was performed reactive ion etching (RIE) leaving a thickness of 0.5 μm epilayer before final defect delineation.

Table 2 shows the treatment condition of the SiC substrates and defect density in the corresponding epilayers. The typical BPD density on the substrate surface is ~2.8×$10^4$ $cm^{-2}$. For regular growth on the untreated substrate (Samples #1~#3), the BPD density on the epilayer was 150~232 $cm^{-2}$. When the substrate was pre-treated by the molten mixture for 2~45 min (Samples #4~#7), the BPD density reduced to 11~22 $cm^{-2}$ on the epilayer, which is <0.1% of BPDs on the substrate. The reduction of BPD was independent of the treatment duration (i.e., etch pit size generated on the substrate surface). Shorter time treatment, such as a few minutes soaking in the mixture, did not form any visible etch pits when inspected by Nomarski optical microscope at ×1000 magnification; and there was no surface degradation anywhere on the entire sample surface. Therefore, a few minutes (2 min by example) soaking (pretreatment) in the molten KOH-related mixture can be regarded as a non-destructive substrate pretreatment method to achieve significant reduction of BPDs. The AFM roughness of sample #4 was compared to the epilayer roughness of sample #1 (grown on the untreated substrate). It is found that after 2 min treatment, the substrate surface of sample #4 did not show any increase of roughness. After epitaxial growth, the epilayer roughness of sample #4 (RMS=0.54 nm) was comparable with that of sample #1 (RMS=0.59 nm) which was grown on the untreated substrate.

Figure 8:
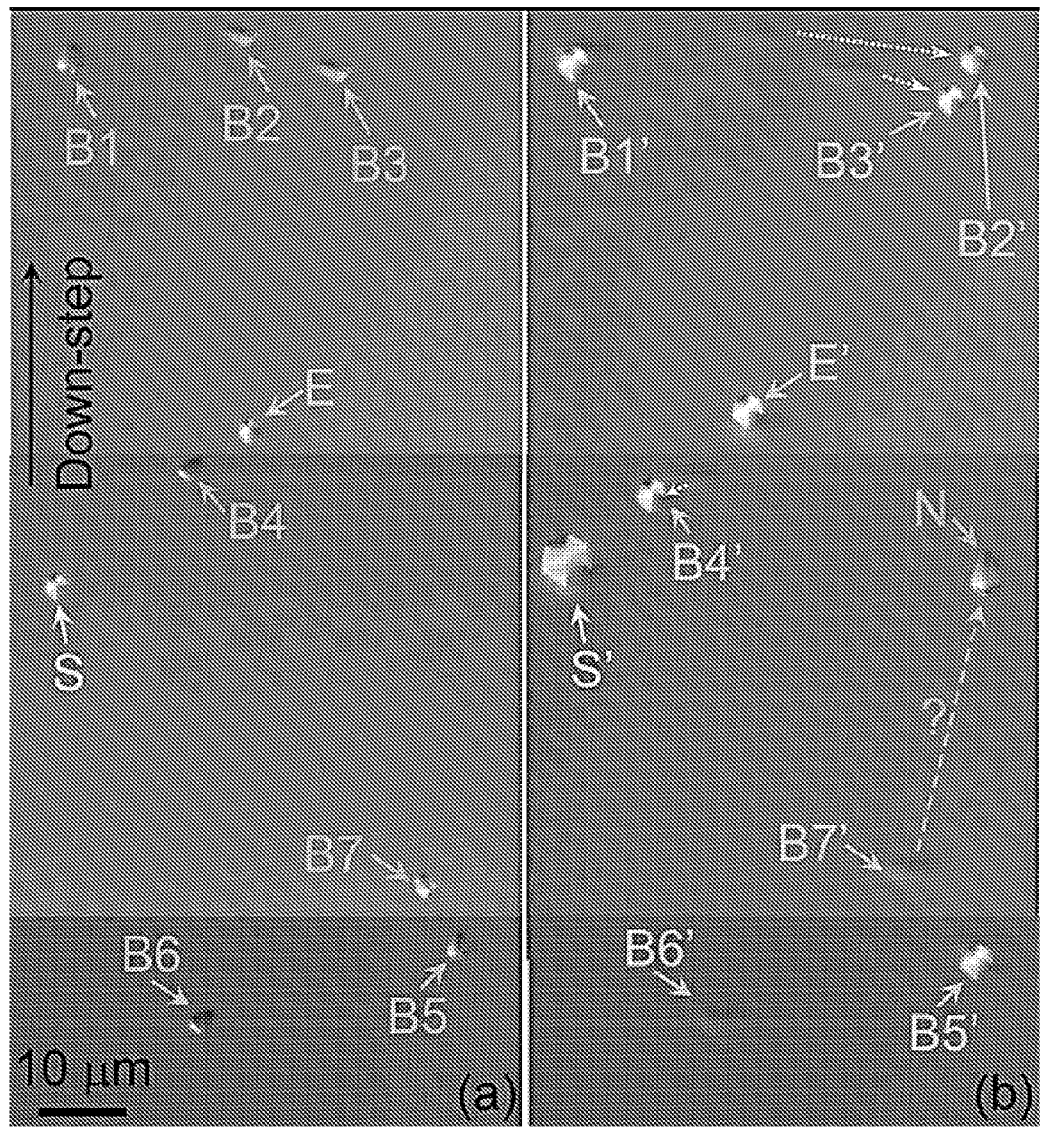
FIG. 8 shows microscope images of the evolution of dislocations in epitaxial growth (of sample #7 in Table 2) on the molten KOH mixture treated (or etched) substrates according to Example 2. It shows the same area of sample #7 on (a) the etched substrate and (b) the etched epilayer grown on the above etched substrate. Threading screw dislocation (TSD) and threading edge dislocation (TED) on the substrate (marked S and E respectively) propagate to the epilayer. BPDs B1-B5 are converted to TEDs, in which B2-B4 show a dislocation shift from their original positions. BPD B6 disappears. BPD B7 may propagate to the epilayer (marked N), or B7 just disappears and BPD N in the epilayer is newly generated.

The BPD evolution in the above process is investigated from sample #7 which substrate was etched for 45 min by the molten KOH-related mixture resulting in etch pits large enough for defect mapping. FIG. 8 shows microscope images of the same area on the etched substrate and on the etched epilayer grown on the same substrate. It is found that most (about 99.9%) BPDs on the substrate were converted to TEDs (BPDs B1~B5 in FIG. 8) or disappear (BPD B6 in FIG. 8). Very few (about 0.1%) BPDs on the substrate propagate into the epilayer (BPD B7 in FIG. 8). Further optimization of the temperature profile in the furnace and decomposition process of precursor gases can completely eliminate these BPDs to achieve a BPD-free epilayer (100% conversion of BPDs on the substrate surface).

In order to know where the BPDs were converted in the epilayer, sample #8 substrate was given a 2 min pretreatment prior to epigrowth. The grown epilayer (~6 μm) was then etched by reactive ion etching (RIE) to remove most part of the epilayer, leaving an epilayer of ~0.5 μm thickness. Then, it was etched to reveal defects on the thin epi surface. Table 2 shows that the BPD and TED densities on this 0.5 μm thickness epilayer were similar to those on the thicker (~6 μm) epilayer (samples #4-#7). This implied that all the BPD conversions occurred within the 0.5 μm thickness, i.e., very close to the epilayer/substrate interface.

The molten mixture was also employed to pretreat the 4° off 4H—SiC substrates or buffer epilayers thereon prior to epitaxial growth. As shown in Table 3, for epitaxial growth on 4° SiC substrate (whether treated or untreated), the BPD density on the epilayer decreased with increasing epilayer thickness, indicating that BPDs were converted throughout the epilayer thickness. For growth on the pretreated substrates, the BPD density decreased from 12 to 2.5 cm$^{-2}$ as epilayer thickness increased from 1.5 to 15.2 μm, which is approximately one order of magnitude less than that in epilayers grown on untreated substrates. Therefore, the pretreatment method greatly enhanced the BPD conversion in the vicinity of epilayer/substrate interface. A 3 min (or less) soaking of the 4° off SiC substrate in the molten KOH-related mixture can be applied as a standard non-destructive pretreatment method preserving the high BPD conversion rate. For epitaxial growth on the buffer-epilayer which is pretreated by the molten mixture, zero-BPD was achieved in the subsequently grown main epilayers even for very thin layers (as shown in samples #23-25 in Table 3).

TABLE 3

Pretreatment duration of 4° SiC substrate[a] (or 1.5 μm thick buffer epilayer for samples 23-25) by the molten KOH-related mixture and BPD density on the epilayer (or on the main epilayer for samples 23-25) for different epilayer thicknesses.

| Sample No. | Substrate (or buffer epilayer) pretreatment duration | Epilayer thickness (μm) | BPD density on the epilayer (cm$^{-2}$) |
|---|---|---|---|
| 9 | No | 1.5 | 85 |
| 10 | No | 3.5 | 62 |
| 11 | No | 6.9 | 41 |
| 12 | No | 8.1 | 62 |
| 13 | 3 min | 1.5 | 12 |
| 14 | 3 min | 3.6 | 9.1 |
| 15 | 3 min | 3.6 | 4.0 |
| 16 | 3 min | 6.1 | 2.6 |
| 17 | 3 min | 7.2 | 7.5 |
| 18 | 3 min | 7.2 | 4.5 |
| 19 | 15 min | 7.2 | 7.1 |
| 20 | 40 min | 7.2 | 5.2 |
| 21 | 3 min | 15.2 | 4.7 |
| 22 | 3 min | 15.2 | 2.5 |
| 23 | 2 min | 1.5 | 0 |
| 24 | 2 min | 3.5 | 0 |
| 25 | 2 min | 6.5 | 0 |

[a]The average BPD density on the 4° SiC substrate is 8.4 × 10$^3$ cm$^{-2}$.

In summary, treating the SiC substrate with the molten mixture for a few minutes is simple, non-destructive, and highly efficient to reduce BPDs in the subsequently grown epitaxial film. No subsequent polishing of the grown epilayer is needed for further device fabrication. Thus, this pretreatment method shows high potential to be applied as one of the routine treatment steps prior to SiC epitaxial growth to increase the BPD conversion.

EXAMPLE 3

A fluorinated silicon precursor, silicon tetrafluoride (SiF$_4$), was employed in SiC CVD growth to investigate the pretreatment method. The substrates are cut from a 4° off-axis 4H—SiC wafer and epitaxial growth (~4 μm) is first carried out without any pretreatment and a surprisingly low BPD density was observed (5 cm$^{-2}$) compared to the other growth method mentioned in Table 2 (sample 1, 2 and 3) using DCS as the Si precursor. Later in other experiments the surface was treated by the molten KOH-related mixture for 2 min. Epitaxial growth was then carried out using the novel SiF$_4$ precursor described earlier on the pretreated substrate. The grown epilayer was completely BPD free, indicating that 100% BPD conversion was achieved (Table 4) at the initial stage of epigrowth (i.e., very close to the epilayer/substrate interface). This accomplishment of 100% substrate BPD conversion was accomplished from the substrate pretreatment combined with the use of the SiF$_4$ precursor.

TABLE 4

Comparison of BPD conversion using SiF$_4$ mediated growth with or without substrate pretreatment by molten KOH-related mixture etching.

| | Epilayer grown using SiF$_4$ without any pretreatment | Epilayer grown using SiF$_4$ with KOH-related mixture pretreatment |
|---|---|---|
| BPD density (cm$^{-2}$) | 5 | 0 |

The invention claimed is:

1. A method of forming an epilayer on a surface of a substrate, the method comprising:
 positioning the substrate within a hot wall CVD chamber, wherein the substrate is a silicon carbide seed substrate;
 introducing $SiF_4$ as a fluorinated Si-source gas and introducing a carbon source gas into the hot wall CVD chamber; and
 growing a homeoepitaxial film on the silicon carbide seed substrate upon chemical reaction of the $SiF_4$ with the carbon source gas, the homeoepitaxial film comprising a 4H or 6H SiC crystal, the homeoepitaxial film growing on the silicon carbide seed substrate at a growth temperature within the hot wall CVD chamber of about 1400° C. to about 2000° C., the homeoepitaxial film comprising silicon and carbon in the 4H or 6H crystal at a 1:1 stoichiometric ratio.

2. The method as in claim 1, wherein the growth temperature is about 1500° C. to about 1800° C.

3. The method as in claim 1, wherein parasitic deposition is substantially prevented on the reactor parts to increase the reusability of the reactor parts and enable longer duration growth.

4. The method as in claim 1, further comprising:
 prior to growing the homeoepitaxial film, growing a buffer epilayer on the surface of the silicon carbide seed substrate, wherein the buffer epilayer comprises SiC.

5. The method as in claim 1, further comprising:
 prior to growing the homeoepitaxial film, applying a molten mixture onto the surface of the silicon carbide seed substrate to form a treated surface thereon, wherein the molten mixture comprises KOH and a buffering agent.

6. The method as in claim 5, wherein the buffering agent comprises MgO, GaO, or a mixture thereof.

7. The method as in claim 1, further comprising:
 prior to growing the homeoepitaxial film, applying a molten mixture onto the surface of the silicon carbide seed substrate to form a treated surface thereon, wherein the molten mixture comprises KOH—NaOH eutectic and a buffering agent.

8. The method as in claim 1, wherein during the growth of the homeoepitaxial film, the CVD chamber has an atmosphere that includes Si—Si vapor in an amount that is less than 5% by volume.

9. The method as in claim 8, wherein during the growth of the homeoepitaxial film, the atmosphere of the CVD chamber includes Si—Si vapor in an amount that is less than 1% by volume.

10. The method as in claim 8, wherein during the growth of the homeoepitaxial film, the atmosphere of the CVD chamber is substantially free from Si—Si vapor.

11. The method as in claim 1, wherein the fluorinated Si-source gas is the only silicon source introduced into the hot wall CVD chamber.

12. The method as in claim 1, wherein the fluorinated Si-source gas is the only fluorine source introduced into the hot wall CVD chamber.

13. The method as in claim 1, wherein the carbon source gas comprises propane.

14. The method as in claim 1, wherein the carbon source gas comprises methane.

15. The method as in claim 1, wherein the carbon source gas comprises ethylene.

16. The method as in claim 1, wherein the volumetric ratio of the fluorinated Si-source gas to the carbon source gas is sufficient to provide a C:Si ratio of about 0.3 to about 1.6.

17. The method as in claim 16, wherein the substrate is a 4H SiC substrate.

18. The method as in claim 1, wherein the homeoepitaxial film is grown to a thickness that is about 1 μm to about 100 μm.

19. The method as in claim 1, wherein the homeoepitaxial film is grown to a thickness that is greater than 100 μm.

20. The method as in claim 1, wherein the homeoepitaxial film has a smooth surface having a roughness RMS of about 0.5 nm or less.

21. The method as in claim 1, wherein the homeoepitaxial film is grown at a growth rate of about 1 μm/hour to about 30 μm/hour.

22. The method as in claim 1, wherein the homeoepitaxial film is grown at a growth rate of 30 μm/hour or faster.

23. The method as in claim 1, wherein the silicon carbide seed substrate is cut off-axis at an angle of 4° or 8°.

* * * * *